(12) United States Patent
Limb et al.

(10) Patent No.: US 7,498,119 B2
(45) Date of Patent: Mar. 3, 2009

(54) PROCESS FOR FORMING A FEATURE BY UNDERCUTTING A PRINTED MASK

(75) Inventors: Scott Limb, Palo Alto, CA (US); William Wong, San Carlos, CA (US); Steven Ready, Mountain View, CA (US); Michael Chabinyc, Burlingame, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 448 days.

(21) Appl. No.: 11/336,365

(22) Filed: Jan. 20, 2006

(65) Prior Publication Data
US 2007/0172774 A1    Jul. 26, 2007

(51) Int. Cl.
*G03F 7/20* (2006.01)
*G03F 7/26* (2006.01)
*G03F 7/38* (2006.01)

(52) U.S. Cl. .................. 430/311; 430/322; 430/324; 430/325

(58) Field of Classification Search ............ 430/311, 430/322, 324, 325
See application file for complete search history.

(56) References Cited

U.S. PATENT DOCUMENTS

| | | | |
|---|---|---|---|
| 3,958,252 A | 5/1976 | Kashio | |
| 4,131,899 A | 12/1978 | Christou | |
| 4,533,624 A | 8/1985 | Sheppard | |
| 4,959,674 A | 9/1990 | Khuri-Yakub et al. | |
| 5,958,122 A | 9/1999 | Fukuda et al. | |
| 6,116,718 A | 9/2000 | Peeters et al. | |
| 6,742,884 B2 | 6/2004 | Wong et al. | |
| 6,759,713 B2 | 7/2004 | Chabinyc et al. | |
| 6,872,320 B2 | 3/2005 | Wong et al. | |
| 6,872,588 B2 | 3/2005 | Chabinyc et al. | |
| 6,890,050 B2 | 5/2005 | Ready et al. | |
| 6,972,261 B2 | 12/2005 | Wong et al. | |
| 2002/0097356 A1 | 7/2002 | Tomomi | |
| 2002/0154187 A1* | 10/2002 | Wong et al. | 347/17 |
| 2002/0164884 A1* | 11/2002 | Lishan | 438/739 |
| 2004/0147066 A1* | 7/2004 | Yamazaki et al. | 438/151 |
| 2005/0069819 A1* | 3/2005 | Shiobara | 430/327 |
| 2005/0136358 A1 | 6/2005 | Paul et al. | |
| 2005/0255392 A1* | 11/2005 | Tsai et al. | 430/7 |

FOREIGN PATENT DOCUMENTS

| | | |
|---|---|---|
| GB | 2127751 A | 4/1984 |
| JP | 01003663 A | 1/1989 |

OTHER PUBLICATIONS

European Search Report, EP 07100906, dated Mar. 27, 2008 (8 pages).
European Search Report, EP 07100905, dated Mar. 27, 2008 (7 pages).

* cited by examiner

*Primary Examiner*—Kathleen Duda
*Assistant Examiner*—Brittany Raymond
(74) *Attorney, Agent, or Firm*—Jonathan A. Small

(57) ABSTRACT

A print patterned mask is formed a digital lithographic process on the surface of a photoresist or similar material layer. The print patterned mask is then used as a development or etching mask, and the underlying layer overdeveloped or overetched to undercut the print patterned mask. The mask may be removed and the underlying structure used an etch mask or as a final structure. Fine feature widths, narrower the minimum width of the print patterned mask features, may be obtained while realizing the benefits of digital lithography in the manufacturing process.

31 Claims, 18 Drawing Sheets

PROCESS FOR FORMING A FEATURE BY UNDERCUTTING A PRINTED MASK

CROSS-REFERENCE TO RELATED APPLICATIONS

The present invention is related to U.S. Pat. No. 7,365,022, titled "Additive Printed Mask Process And Structures Produced Thereby" by Wong et al., filed on the same filing date and assigned to the same assignee as the present application, and further which is hereby incorporated herein by reference.

BACKGROUND OF THE INVENTION

1. Field of the Invention

This invention relates generally to electronic device fabrication processes, and more particularly to a method of employing a printed mask to form features narrower than the printed mask feature width.

2. Description of the Prior Art

Digital lithography is a maturing technology designed to reduce the costs associated with photolithographic processes, used often in the fabrication of micro-electronic devices, integrated circuits, and related structures. Digital lithography directly deposits patterned material onto a substrate in place of the delicate and time-consuming lithography processes used in conventional manufacturing processes. The printed pattern produced by digital lithography can either comprise actual device features (i.e., elements that will be incorporated into the final device or circuitry, such as the source, drain, and gate regions of thin film transistors, signal lines, opto-electronic device components, etc.) or it can be a mask for subsequent semiconductor processing (e.g., etch, implant, etc.) Importantly, unlike traditional lithographic systems, digital lithography systems avoid the cost and challenges associates with the use of reticles or masks.

Typically, digital lithography involves depositing a print material by moving a printhead and a substrate relative to one another along a single axis (the "print travel axis"). Print heads, and in particular, the arrangements of the ejectors incorporated in those print heads, are optimized for printing along this print travel axis. Printing takes place in a raster fashion, with the print head making "printing passes" across the substrate as the ejector(s) in the print head dispense individual "droplets" of print material onto the substrate. Typically, the print head moves relative to the substrate in each printing pass, but the equivalent result may be obtained if the substrate is caused to move relative to the print head (for example, with the substrate secured to a moving stage) in a printing pass. At the end of each printing pass, the print head (or substrate) makes a perpendicular shift relative to the print travel axis before beginning a new printing pass. Printing passes continue in this manner until the desired pattern has been fully printed onto the substrate.

Materials typically printed by digital lithographic systems include phase change material, solutions of organic polymers, and suspensions of materials with desired electronic properties in a solvent or carrier. For example, U.S. Pat. Nos. 6,742,884 and 6,872,320 (each incorporated herein by reference) teach a system and process, respectively, for printing a phase change material onto a substrate for masking. According to these references, a suitable material, such as a stearyl erucamide wax, is maintained in liquid phase over an ink-jet style piezoelectric printhead, and selectively ejected on a droplet-by-droplet basis such that droplets of the wax are deposited in desired locations in a desired pattern on a layer formed over a substrate. The droplets exit the printhead in liquid form, then solidify after impacting the layer, hence the material is referred to as phase-change.

Once dispensed from an ejector, a print material droplet attaches itself to the substrate through a wetting action, then proceeds to solidify in place. In the case of printing phase-change materials, solidification occurs when a heated and liquefied printed droplet loses its thermal energy to the substrate and/or environment and reverts to a solid form. In the case of suspensions, after wetting to the substrate, the carrier most often either evaporates leaving the suspended material on the substrate surface or the carrier hardens or cures. The thermal conditions and physical properties of the print material and substrate, along with the ambient conditions and nature of the print material, determine the specific rate at which the deposited print material transforms from a liquid to a solid, and hence the height and profile of the solidified deposited material.

If two adjacent droplets are applied to the substrate within a time prior to the solidification of either or both droplets, the droplets may wet and coalesce together to form a single, continuous printed feature. Surface tension of the droplet material, temperature of the droplet at ejection, ambient temperature, and substrate temperature are key attributes for controlling the extent of droplet coalescence and lateral spreading of the coalesced material on the substrate surface. These attributes may be selected such that a desired feature size may be obtained.

However, one disadvantage of digital lithography is that due to the relatively large minimum drop size, currently on the order of 20-40 μm (micrometers) in diameter, device features manufactured by this process tend to be relatively large. For example, by depositing a series of phase-change material droplets onto a semiconductive layer such that when hardened they form a linear feature, then etching the semi-conductive layer apart from where the layer is covered by the phase change material, the channel for a transistor may be formed. The length of the channel is directly related to the diameter of the droplets, in this case a minimum of 20-40 μm. However, in current micro-electronic, opto-electronic, bio-electronic, and similar applications, device performance requirements mandate much smaller feature sizes, for example on the order of 5-20 μm. While it is known that available printing systems are capable of very accurate drop placement, the relatively large droplet size has heretofore limited the scope of application of digital lithographic systems.

SUMMARY OF THE INVENTION

Accordingly, the present invention provides a method for manufacturing micro-electronic, opto-electronic, bio-electronic, or similar devices employing digital lithography, the devices having smaller feature sizes than heretofore possible with digital lithography.

The process according to the present invention preferably uses a digital lithography system which deposits a phase change material. The phase change material is deposited in a pattern to form an indirect mask. Subsequent steps of the process controllably undercut the indirect mask to produce features of desired dimensions.

According to one aspect of the invention, a print patterned mask is formed over an etch resist layer by digital lithography. The etch resist layer is over-developed so as to undercut the printed mask pattern by a desired amount. The printed mask pattern may optionally be removed at this point. The resist layer is then used as an etch mask to pattern a feature in a layer below it, thereby defining a fine (e.g., 20 μm or smaller)

feature, for example a gate electrode of a thin film transistor (TFT), a sub-pixel frame element of a color filter, etc.

According to another aspect of the present invention, a print patterned mask is formed over an etch resist layer by digital lithography. The etch resist layer is over-developed so as to undercut the printed mask pattern by a desired amount and expose a substrate other than in the locations of the un-etched resist. A thin film is then deposited over the substrate, masked by the etch resist. The print patterned mask and resist are removed, leaving a thin film with a controlled gap therein on the order of the width of the un-etched photoresist. Narrow features and improved quality dark field structures are obtained.

According to still another aspect of the present invention, a target material is deposited over a substrate. A print patterned mask is then formed over the target material by digital lithography. The target material is then removed, using the print patterned mask initially to limit the removal. However, the removal process continues such that the target material is undercut below the mask. The extent of the undercutting is controlled to obtain the desired feature width. The mask is then removed, leaving the target features of desired dimensions.

According to a variation of this aspect of the present invention, the target material is a black matrix. The black matrix in this variation can be, for example, an opaque negative photo-definable polymer. The undercutting of the black matrix is accomplished by controllably over-developing the material. The extent of the over-development is controlled to obtain black matrix target features on the order of 20 μm wide or narrower to form elements of a sub-pixel frame for a color filter. The sub-pixel frame elements are narrower than the diameter of the individual droplets forming the mask.

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION OF THE INVENTION

Figure 1A:
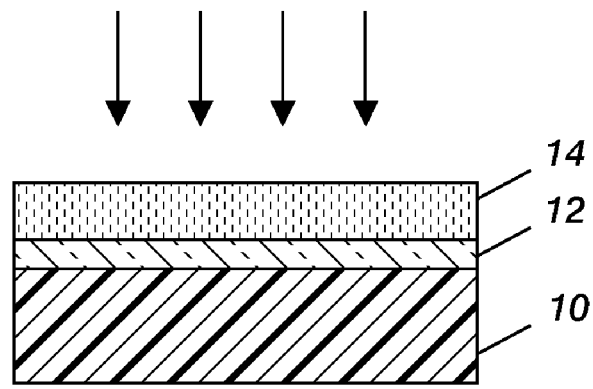
FIG. 1A is a cross sectional view of a structure at a first stage in the process of forming a thin film fine feature according to one embodiment of the present invention.
Figure 1B:
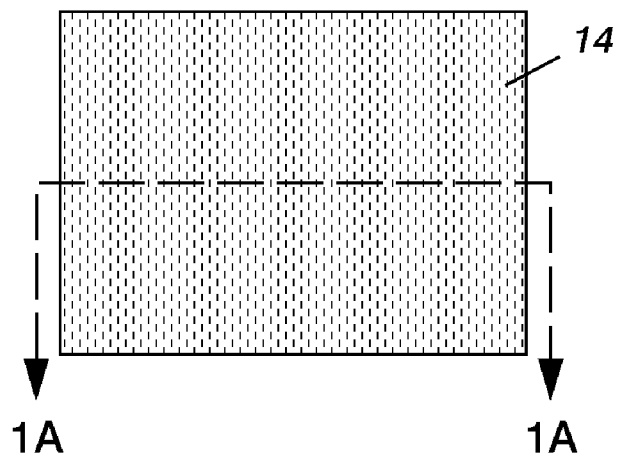
FIG. 1B is a plan view of the structure shown in FIG. 1A.

With reference to FIGS. 1A though 1J and 2, an exemplary process according to the present invention is described. FIGS. 1A through 1J illustrate a device at several intermediate stages of its production according to a process illustrated in FIG. 2. While the following description makes specific reference to the device illustrated in FIGS. 1A through 1J, without making more specific reference thereto the description is following the sequence illustrated in FIG. 2.

With reference initially to FIG. 1A, the process begins with a suitable substrate 10, such as silicon, fused silica glass, quartz, sapphire, MgO, or plastic, such as poly ethylene napthalate etc. which is cleaned and prepared with an HMDS solution and/or plasma cleaning, and onto which is deposited a thin film layer 12. In the case in which a color filter panel is to be produced, the substrate will typically be a transparent material, such as glass or plastic. The surface of substrate 10 may be treated to improve the adhesion of the thin film layer 12, as understood in the art. Thin film layer 12 may be a metal, semiconductor, insulator or a layer with other desired properties (e.g., thermal insulation, optical filtering, etc.) Thin film layer 12 may be deposited by any method appropriate for its composition and application, such as sputtering, chemical vapor deposition (CVD), etc.

A resist layer 14 is next deposited over thin film layer 12, for example by a spin-on process. By way of example, resist layer 14 is a positive photoresist. Typical photoresists which may be employed include Shipley 1808, Shipley 1818, etc., available from distributors for the Shipley Corporation (1-800-837-2515). The resist layer 14 (more typically the entire structure) at this point is heated to a moderate temperature (soft bake), which cures and hardens resist layer 14. Resist layer 14 is then exposed to UV radiation to permit development of the resist layer. The structure may then be heated to a higher temperature (hard bake) primarily to decrease the dissolution rate. The structure at this stage of the production process is shown in plan view in FIG. 1B.

Figure 1C:
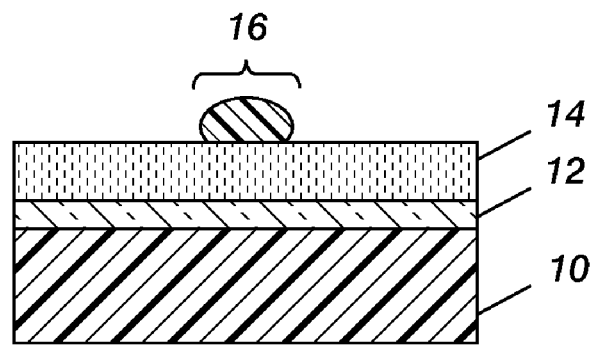
FIG. 1C is a cross sectional view of a structure at a second stage in the process of forming a thin film fine feature according to one embodiment of the present invention.
Figure 1D:
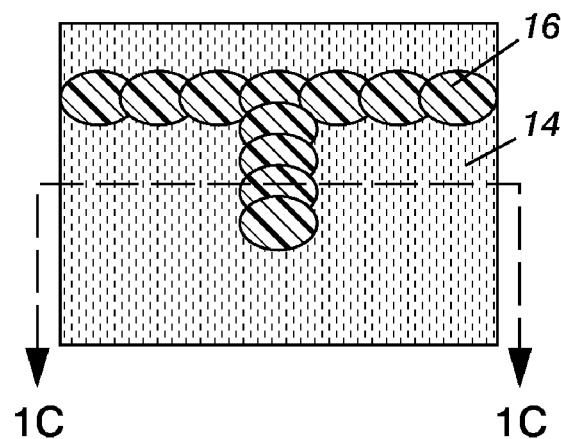
FIG. 1D is a plan view of the structure shown in FIG. 1C.
Figure 2:
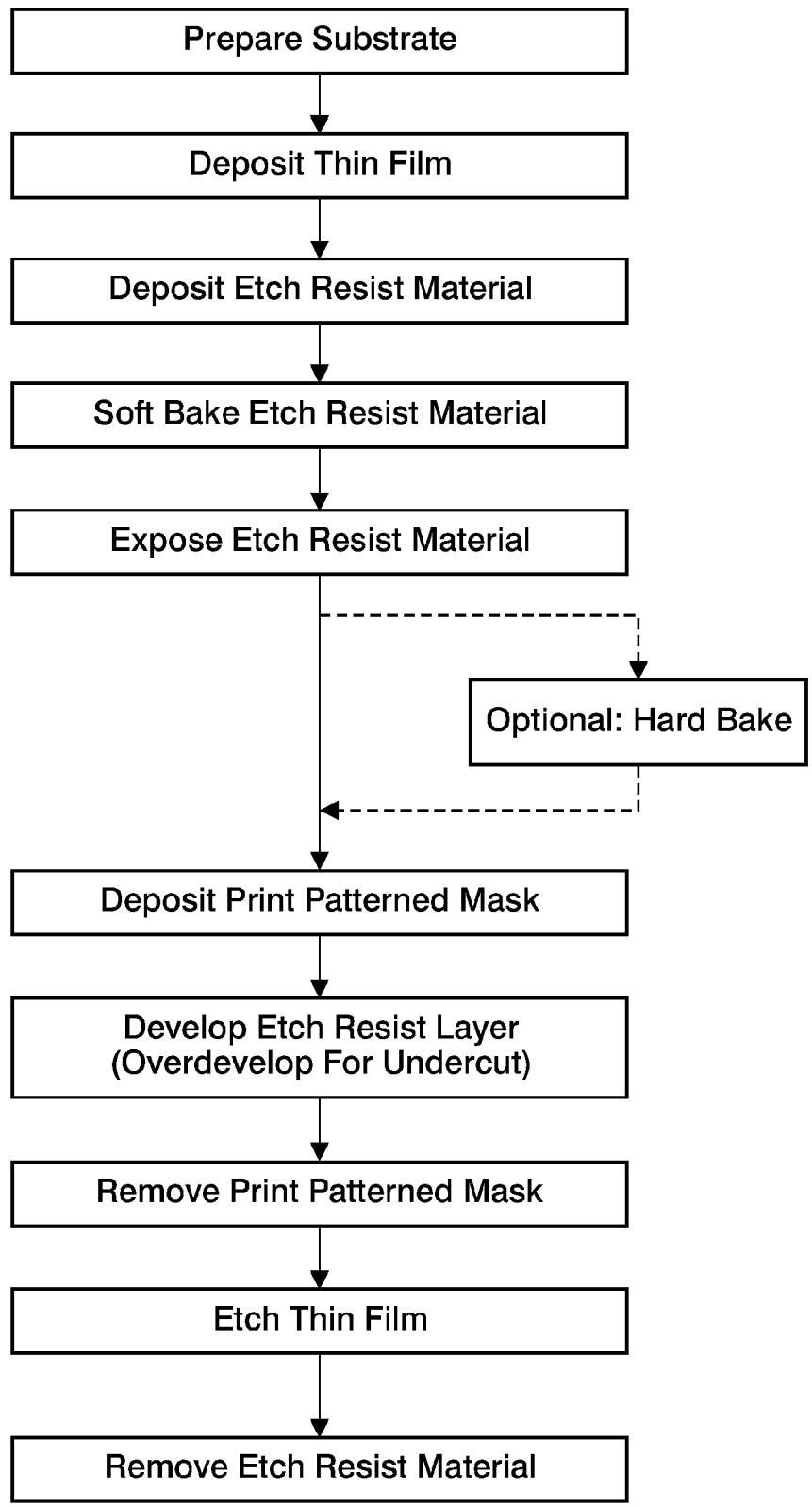
FIG. 2 is a process flow diagram illustrating the steps involved in the formation of a thin film fine feature according to one embodiment of the present invention.

A print patterned mask 16 is then formed on the surface of resist layer 14, as shown in FIGS. 1C and 1D. Print patterned mask 16 is preferably formed by a digital lithographic process, and is formed from individually ejected droplets (which may coalesce into a single structure) of a phase change material such as stearyl erucamide wax (for example, Kemamide 180-based wax from Xerox Corporation of Stamford, Conn.), or similar material which is well controlled in terms of print quality (i.e., droplet size and shape, solidification time, hardness of solidified structure, etc.) Examples of systems appropriate for the ejection of droplets of phase change material include: ink-jet systems (such as disclosed in U.S. Pat. No. 4,131,899, which is incorporated herein by reference), ballistic aerosol marking (BAM) devices (such as disclosed in U.S. Pat. No. 6,116,718, which is incorporated herein by reference), acoustic ink printer (AIP) systems (U.S. Pat. No. 4,959,674, which is incorporated herein by reference), carrier-jet ejectors (as disclosed in U.S. Pat. No. 5,958,122, which is incorporated by reference herein), deflection-controlled ink-jet systems (such as disclosed in U.S. Pat. No. 3,958,252, which is incorporated herein by reference), etc. Such systems also include pattern transfer systems, such as: xerographic, ionographic, screen, contact, and gravure printing systems, etc.

While the embodiment discussed herein involves the formation of a print patterned mask directly on resist layer 14, with only the substrate 10 and thin film layer 12 thereunder, it is within the spirit and scope of the present invention that there may be underlying layers containing previously formed devices or structures. Accordingly, it may be necessary to positionally register the formation of mask 16. Registration is routinely accomplished in digital lithographic systems by use of fiduciary marks, digital imaging and processing, and processor controlled relative motion of the ejector and the substrate. The ability to align the mask layer through image processing prior to patterning is a significant advantage of the digital-lithographic process over other patterning methods.

For illustrative purposes, mask 16 is shown as a collection of coalesced individual droplets (in actual application, however, it may be difficult to discern individual droplets is the mask structure), each droplet on the order of 25-30 µm in diameter. The width of the mask features may be an arbitrary size greater than or equal to the minimum diameter of a droplet ejected by the digital lithography system used, depending on the feature and device to be formed. For example, to achieve a width greater than the diameter of a single droplet, adjacent droplets may be deposited such that they coalesce into a single feature as they solidify.

Figure 1E:
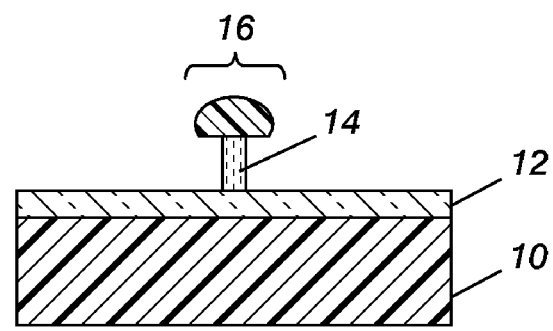
FIG. 1E is a cross sectional view of a structure at a third stage in the process of forming a thin film fine feature according to one embodiment of the present invention.
Figure 1F:
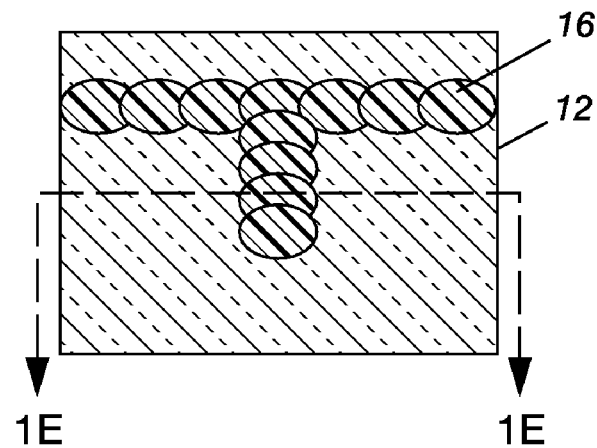
FIG. 1F is a plan view of the structure shown in FIG. 1E.

With reference to FIGS. 1E and 1F, resist layer 14 is then developed, by techniques and with materials, such as TMAH, known in the art. Mask 16 serves initially as a physical mask to protect areas thereunder from development. However, the development of resist layer 14 is allowed to continue in a controlled fashion such that a desired amount of the resist is removed by development from underneath mask 16. The undercut development rate is relatively constant, so that a fine degree of control is permitted over material removal. The undercut dissolution rate was found to be 12 µm/min but this rate is specific to the process parameter and developer used. In addition, the dissolution rate is similar for both the bulk and undercut portions. Three wafers have been tested to determine the process uniformity. All wafers were processed at different times. Shipley 1813 resist was spun on with a thickness of 3 um. Wafer to wafer and within wafer undercut uniformity was found to be good for all samples. Within wafer undercut non-uniformity was +/−4%. Wafer to wafer non-uniformity was +/−3%. This is consistent with dissolution rates of exposed photoresist needing to be welled controlled with fine Linewidth microelectronics. The development process proceeds until the width of the remaining photoresist is as desired, for example on the order of 5-20 µm. The development process is then halted by removal of the developer and rinsing the structure, as is well known.

Figure 1G:
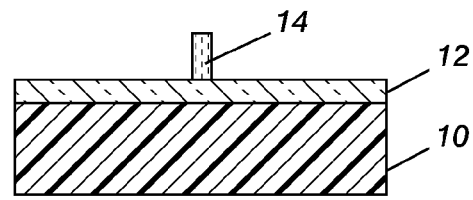
FIG. 1G is a cross sectional view of a structure at a fourth stage in the process of forming a thin film fine feature according to one embodiment of the present invention.
Figure 1H:
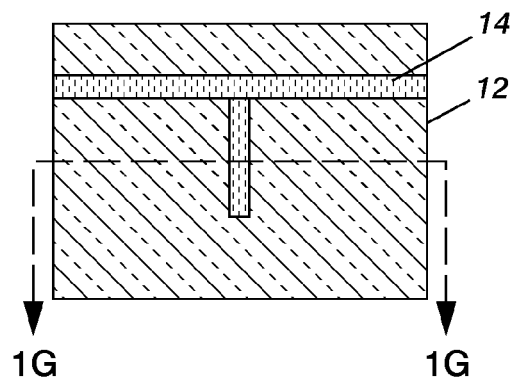
FIG. 1H is a plan view of the structure shown in FIG. 1G.

Mask 16 may then be removed. Depending on the material used for the mask, certain solvents and etching solutions are effective for this removal. In the case where the mask is a stearyl erucamide wax, SVC-28 is effective for its removal. SVC-28 is a debonding solution manufactured by Rohm-Hass (http://www.rohmhaas.com/). The active ingredients are dipropylene glycol monomethyl ether, citrus distallate, synthetic isoparraffinic hydrocarbon, and aliphatic hydrocarbon. The structure now appears as shown in FIGS. 1G and 1H. Alternatively, mask 16 may be removed after the step of etching, which is described next.

Figure 1I:
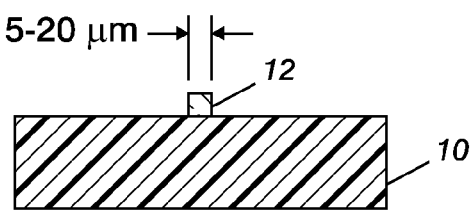
FIG. 1I is a cross sectional view of a structure at a final stage in the process of forming a thin film fine feature according to one embodiment of the present invention.
Figure 1J:
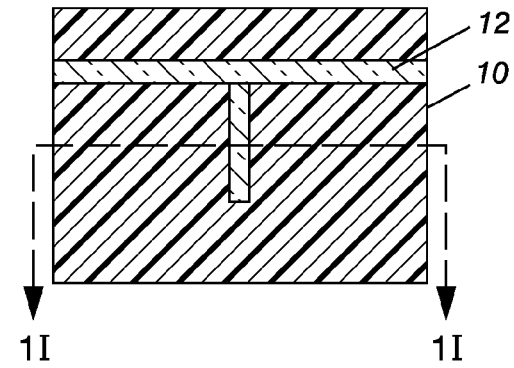
FIG. 1J is a plan view of the structure shown in FIG. 1I.

That portion of resist layer 14 remaining after development is then used as an etch mask to etch thin film layer 12. A suitable etchant is employed which is effective at etching and removing thin film layer 12, but not the remaining portion of resist layer 14. The etch proceeds generally anisotropically, so that following the etch that portion of thin film layer 12 remaining is approximately the same width as the width of the resist layer which masked the etching. The remaining portion of resist layer 14 may then be stripped by processed well known in the art. The final structure produced according to this aspect of the invention is a thin film fine feature, whose width is less than the width of the print patterned mask 16 used for its formation. This structure is illustrated in FIGS. 1I and 1J.

Figure 3A:
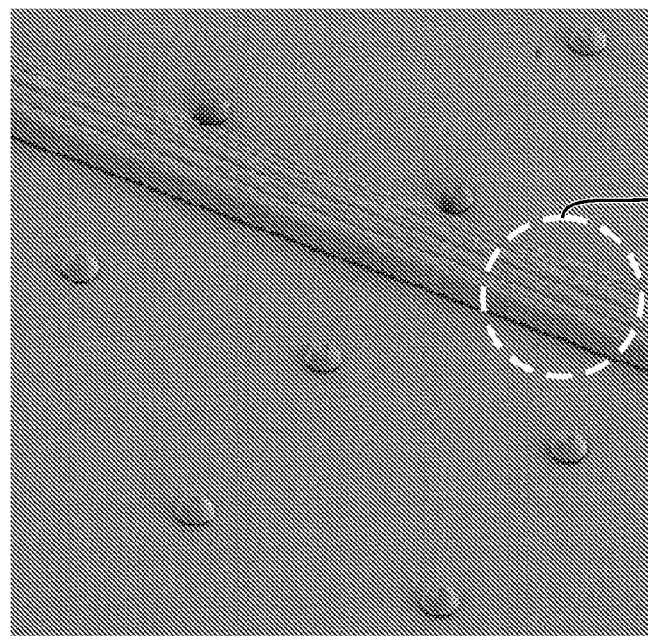
FIGS. 3A and 3B are micrographs of a structure fabricated according to an embodiment of the present invention.
Figure 3B:
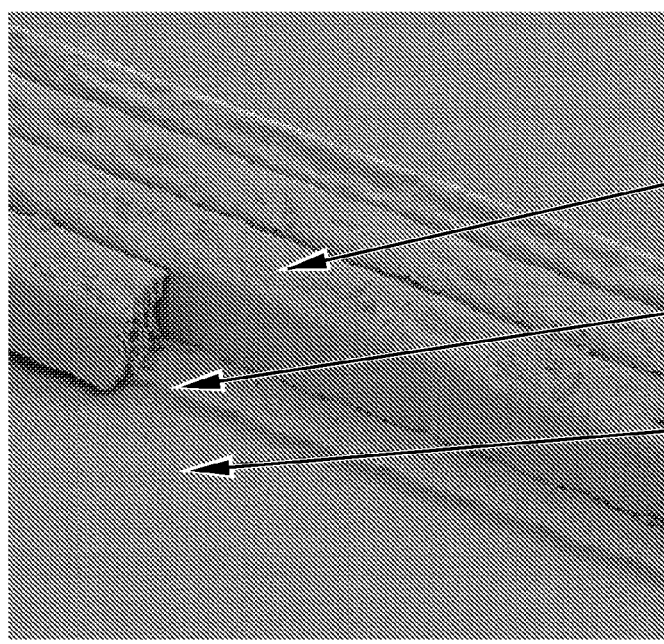
Figure 4:
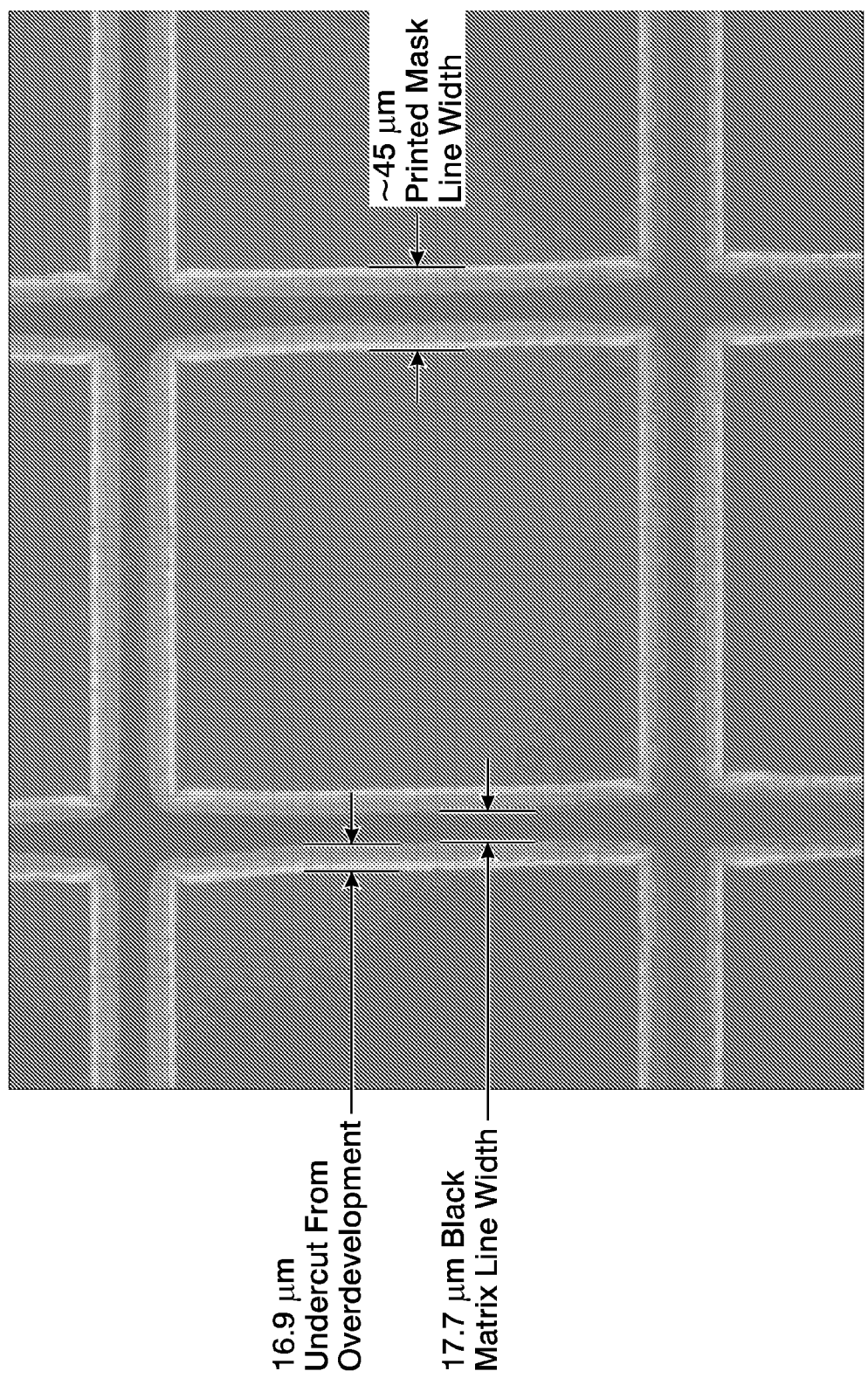
FIG. 4 is a an optical micrograph of a printed wax structure over photoresist, with undercut resist features, produced by a process according to one embodiment of the present invention.

An example of a structure fabricated according to the above-described process is illustrated in the SEM micrographs of FIGS. 3 and 4. The structure of FIGS. 3 and 4 are a series of wax lines deposited by digital lithography over a 3 μm thick photoresist layer over a Si substrate. In FIG. 3A a series of individual droplets are shown for scale and illustration. FIG. 3B is a high magnification view of the structure of FIG. 3A, with a portion of one of the lines removed to more clearly shown the undercut photoresist which resulted from controlled overdevelopment according to the present invention. FIG. 4 is an optical micrograph of a printed wax structure over photoresist, with undercut resist features, produced by a process according to one embodiment of the present invention. The micrograph was taken through the backside of a glass substrate. As an example of processing parameters, the total development time was 90 seconds, including 60 seconds to overdevelop and undercut the printed mask material.

Figure 5A:
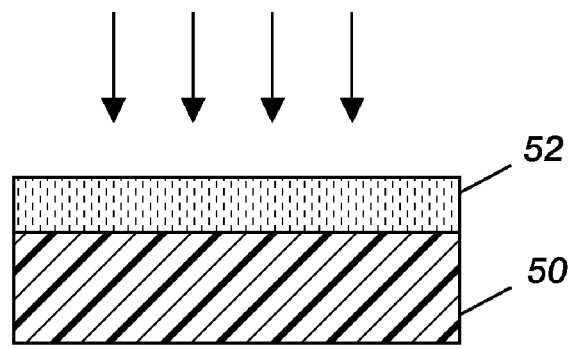
FIG. 5A is a cross sectional view of a structure at a first stage in the process of forming a thin film fine feature according to a second embodiment of the present invention.
Figure 5B:
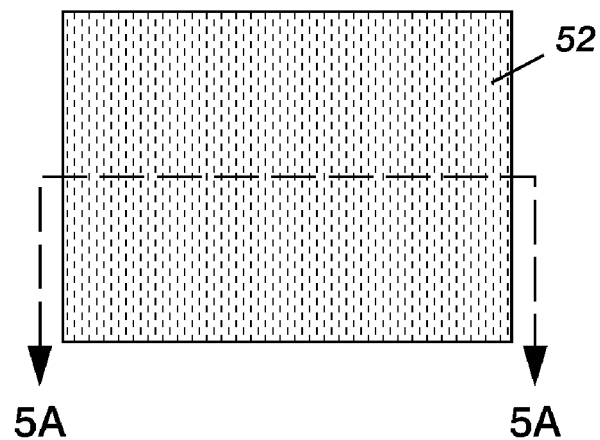
FIG. 5B is a plan view of the structure shown in FIG. 5A.
Figure 5C:
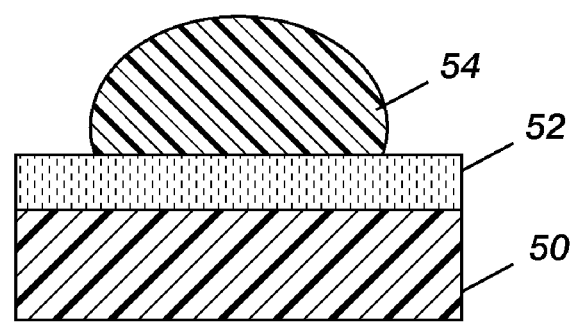
FIG. 5C is a cross sectional view of a structure at a second stage in the process of forming a thin film fine feature according to a second embodiment of the present invention.
Figure 5D:
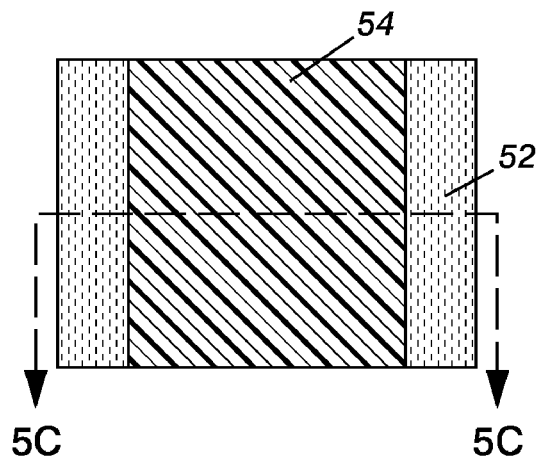
FIG. 5D is a plan view of the structure shown in FIG. 5C.
Figure 5E:
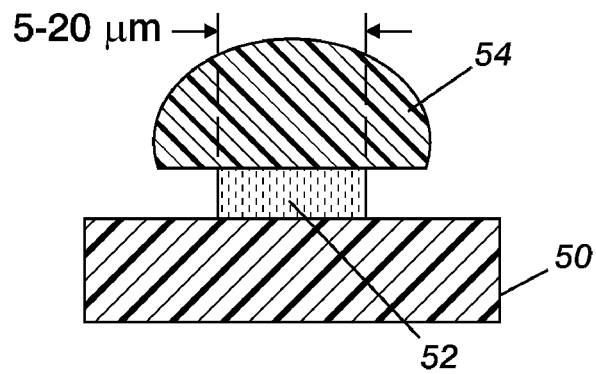
FIG. 5E is a cross sectional view of a structure at a third stage in the process of forming a thin film fine feature according to a second embodiment of the present invention.
Figure 5F:
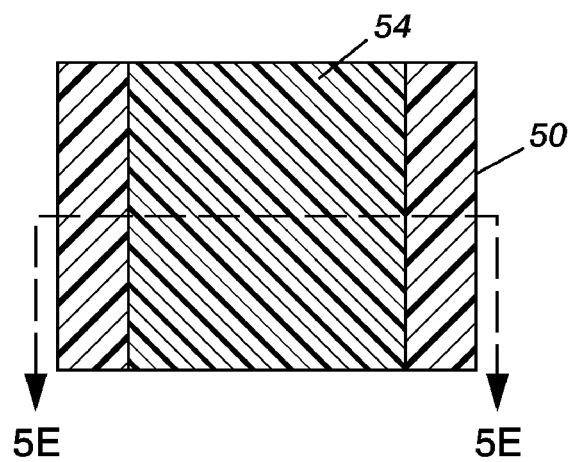
FIG. 5F is a plan view of the structure shown in FIG. 5E.
Figure 5G:
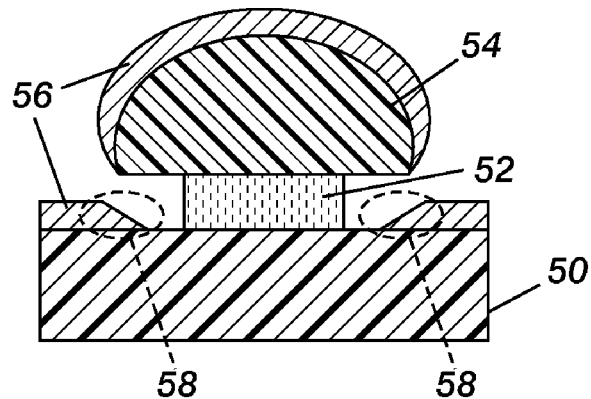
FIG. 5G is a partial cross sectional view of a structure at a final stage in the process of forming a thin film fine feature according to a second embodiment of the present invention, illustrating a fine separation formed between thin film regions.
Figure 5H:
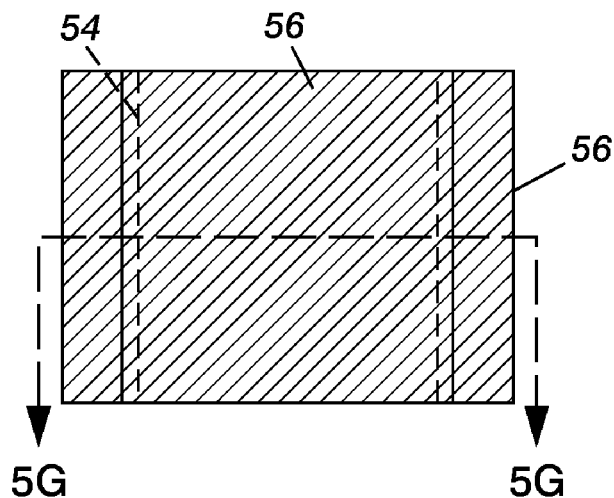
FIG. 5H is a plan view of the structure shown in FIG. 5G.
Figure 5I:
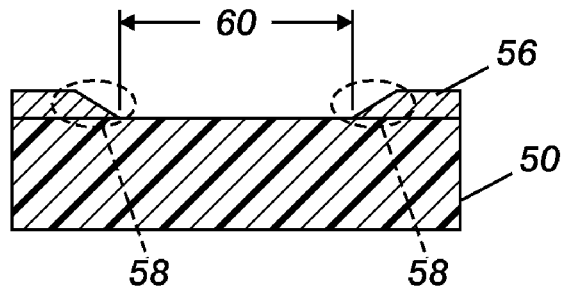
FIG. 5I is a cross sectional view of a structure at a final stage in the process of forming a thin film fine feature according to one embodiment of the present invention.
Figure 5J:
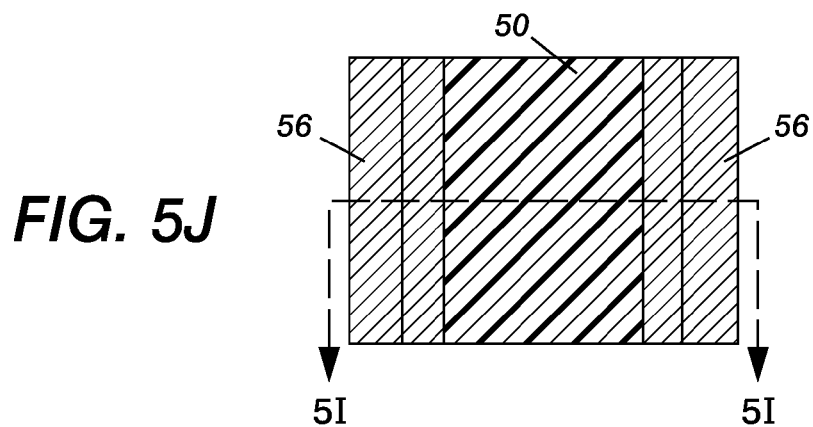
FIG. 5J is a plan view of the a final stage in the process of forming a thin film fine feature according to a second embodiment of the present invention.
Figure 6:
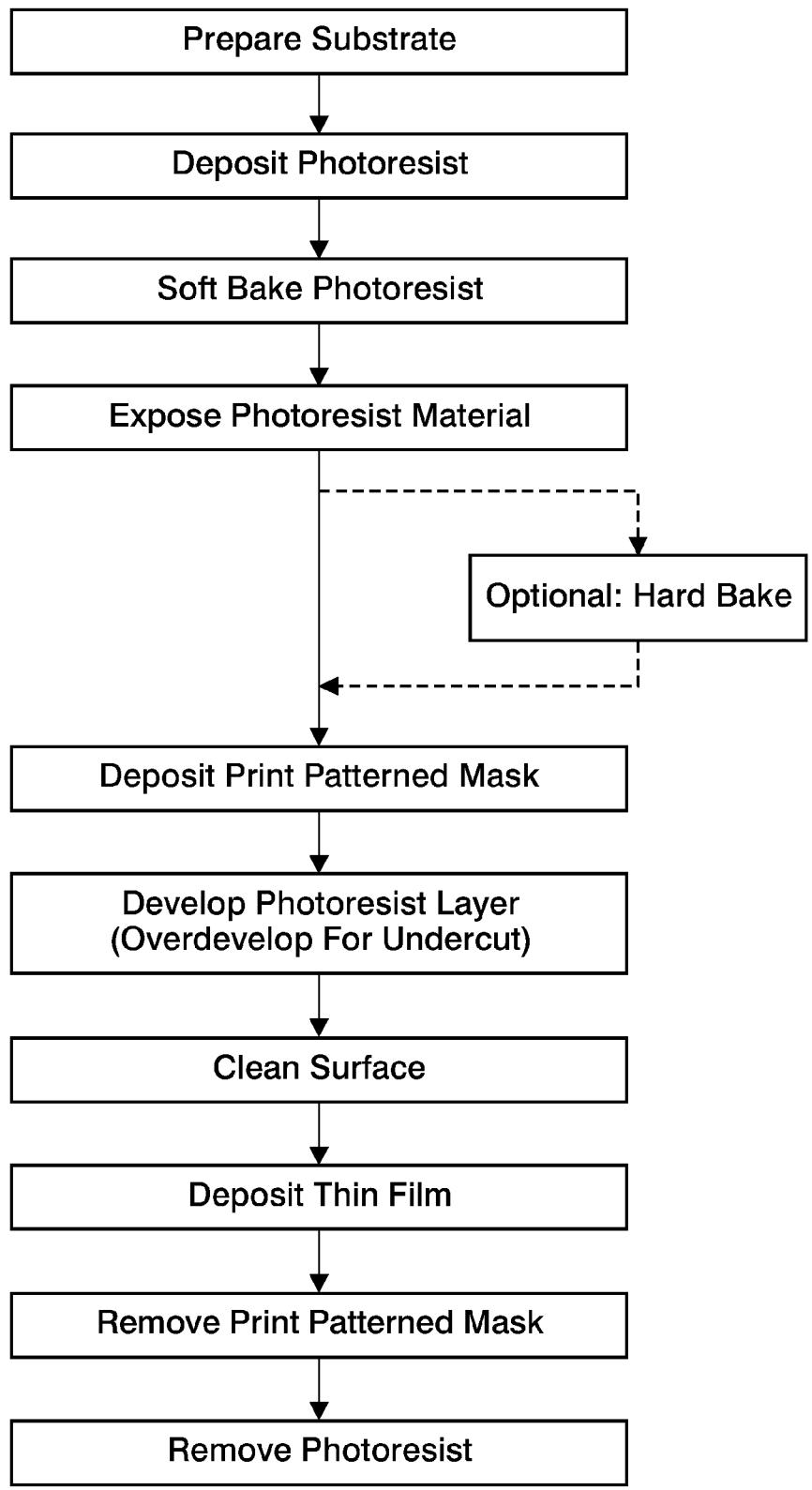
FIG. 6 is a process flow diagram illustrating the steps involved in the formation of a thin film fine feature according to a second embodiment of the present invention.

According to another embodiment of the present invention, a thin film layer is deposited following undercutting of a photoresist layer beneath a print patterned mask, as illustrated in FIGS. 5A though 5J, and FIG. 6. FIGS. 5A through 5J illustrate a device at several intermediate stages of its production according to a process illustrated in FIG. 6. Again, while the following description makes specific reference to the device illustrated in FIGS. 5A through 5J, the process used to form the device follows the sequence of steps illustrated in FIG. 6.

The process according to this embodiment begins with the preparation of an appropriate substrate 50, such as silicon, fused silica glass, quartz, sapphire, MgO, glass or plastic, such as poly ethylene naphthalate, etc., which is cleaned, for example with an HMDS solution and/or plasma cleaning. Again, in the case in which a color filter panel is to be produced, the substrate will typically be a transparent material, such as glass or plastic. A standard photoresist is then spun onto the substrate to form photoresist layer 52. Photoresist layer 52 is then exposed to UV radiation to permit development. The structure may then be hard baked to decrease the etch rate. The structure at this stage of the production process is shown in cross section in FIG. 5A and in plan view in FIG. 5B.

A print patterned mask 54 is then formed on the surface of resist layer 52, as shown in FIGS. 5C and 5D. Print patterned mask 54 is preferably a stearyl erucamide wax deposited by a digital lithography system as previously described. Print patterned mask 54 is shown as a single droplet on the order of 25-30 μm in diameter. While mask 54 is illustrated as a single droplet in FIGS. 5C and 5D, it will be appreciated that mask 54 may be comprised of a plurality of individual or coalesced droplets.

With reference to FIGS. 5E and 5F, photoresist layer 52 is then developed, by techniques and with materials, such as TMAH, known in the art. Mask 54 serves initially as a physical mask to protect areas thereunder from development. However, the development of photoresist layer 52 continues in a controlled fashion such that a desired amount of the photoresist is removed by development from underneath mask 54. The development rate is relatively constant, so that a fine degree of control is permitted over material removal. The undercut dissolution rate was found to be 12 μm/min but this rate is specific to the process parameter and developer used. In addition, the dissolution rate is similar for both the bulk and undercut portions. The development process proceeds until the width of the remaining photoresist is as desired, for example on the order of 5-20 μm. The development process is then halted by removal of the developer and rinsing the structure, as is well known.

All exposed surfaces are then treated, for example by exposure to an $O_2$ plasma (e.g., 2 minutes) to prepare the surface for a thin film deposition. A thin film layer 56 is next deposited over the structure, with print pattern mask 54 masking a portion of the surface of substrate 50. Thin film layer 56 may be a metal, semiconductor, insulator or a layer with other desired properties (e.g., thermal insulation, optical filtering, etc.) Thin film layer 56 may be deposited by any method appropriate for its composition and application, such as sputtering, chemical vapor deposition (CVD), etc. such that print pattern mask 54 masks the deposition. The structure at this point in the manufacturing process is illustrated in FIGS. 5G and 5H.

Under proper conditions, the deposition of thin film 56 is uniform across the substrate. However, in those regions masked by print patterned mask 54, an amount of the thin film material will extend under the mask, toward the remaining portion of photoresist layer 52. The thickness of the thin film 56 decreases in a tapered fashion the closer it is to the remaining photoresist layer 52. This tapered region, referred to as a positive sidewall 58, is shown in FIGS. 5G and 5I.

Print patterned mask 54 is then removed, along with any thin film material deposited thereover, for example using a solvent or etchant, and the remaining portion of photoresist layer 52 is then stripped by processed well known in the art. The final structure produced according to this embodiment of the invention is a thin film with a fine feature gap 60, whose width is less than the width of the print patterned mask 54 used for its formation. This structure is illustrated in FIGS. 1G and 1H.

Figure 5K:
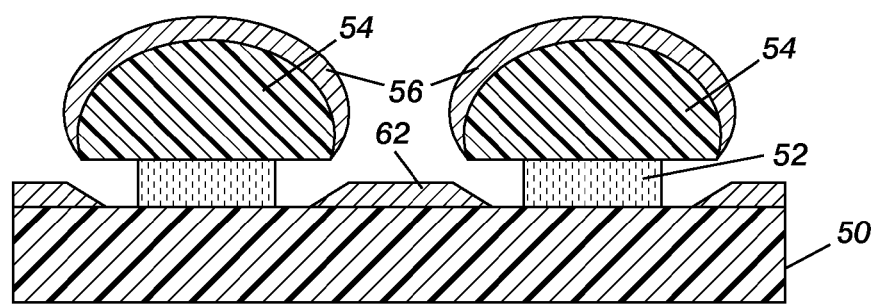
FIG. 5K is a cross sectional view of a structure at a final stage in the process of forming a thin film fine feature according to one embodiment of the present invention.
Figure 5L:
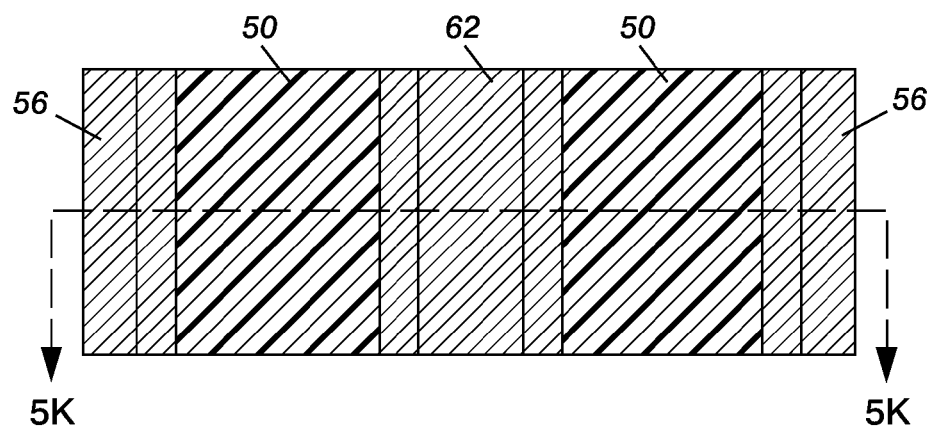
FIG. 5L is a plan view of the a final stage in the process of forming a thin film fine feature according to a second embodiment of the present invention.

Narrow line widths may also be directly formed by the aforementioned process. For example, if two side-by-side structures of the type illustrated in FIGS. 5E and 5F are formed and a thin film deposited thereover, as illustrated in FIG. 5K, a thin film feature 62 may be formed with a width less than the minimum width of the print patterned mask. FIG. 5L illustrates in plan view such as thin film fine feature 62. It will be appreciated that such a fine feature may form an element of a subsequently formed device, such as the gate electrode of a thin film transistor, or other feature, device or structure.

The embodiment described above has the added benefit that large dark field areas may be fabricated with a print patterned mask. The large-scale coalescence of droplets to produce opaque areas of dark-field etch masks (i.e., masks with a majority of the surface masked) has presented the difficulty that such opaque areas a susceptible to various defects which fail to render the desired areas entirely opaque. For example, pinholes or other gaps in the mask area permit undesired processing of portions of the underlying layer(s). Printed masks are particularly vulnerable to such defects, which result from print ejector drop out, droplet misdirection, incomplete coalescence, droplet size variations, etc. Misalignment and poorly defined edges are also undesirable consequences which may be encountered when forming large dark field areas using print patterned phase-change material masks. Furthermore, the printing of large areas with print patterning material is a relatively slow process due to the relatively high number of droplets to be ejected and the time required for large-scale coalescence. Accordingly, the present invention is capable of producing a structure with fine feature sizes while also providing improved large dark field structures where required.

A further embodiment of the present invention uses the concept of undercutting a print patterned mask, but does so without the use of an underlying photoresist layer. The exemplary device produced by the method of the present invention is a sub-pixel frame for a color filter. A color filter is a screen placed in front of a switching matrix for a flat panel display. It is constructed by forming an array of pixels on the surface of a glass or plastic sheet. Each pixel is comprised of three or more sub-pixels. Each sub-pixel is comprised of a color filter material which is primarily transmissive to a narrow color spectrum, such as red, green or blue. Typically the color filter material is lithographically deposited. However, if effective liquid containment can be provided, for example a frame closed on four sides and a base, the color filter material may be deposited in liquid form, similar to the masking material described herein. Thus, it is desirable to provide a method for forming a sub-pixel frame using digital lithography, so that a single process and apparatus may be employed to produce a color filter. However, the specifications of a typical color filter dictate that the width of a sub-pixel frame element be on the order of 5-20 μm, which is less than the minimum width of a mask feature provided by a digital lithography system. Accordingly, the present invention may be employed to provide such a sub-pixel frame element, as described following. Once again, FIGS. 7A through 7G illustrate a sub-pixel element at several intermediate stages of its production according to a process illustrated in FIG. 8. While the following description makes specific reference to the structure illustrated in FIGS. 7A through 7G, the process used to form the structure follows the sequence of steps illustrated in FIG. 8.

The process according to this embodiment begins with the preparation of an appropriate substrate 90, which is cleaned, for example with an HMDS solution and/or plasma cleaning. A black matrix material is then deposited onto the substrate surface to form black matrix layer 92. The black matrix material is typically a photo-curable polymer similar to a negative photoresist with suspended dark pigments such as a polyimide dissolved or suspended in an organic solvent, and may be spin-coated onto the surface of substrate 90. The structure at his point is soft baked to cure and harden the black matrix material. Depending on the type of black matrix used (e.g., similar to positive vs. negative photoresist) it may be flood exposed to UV (or appropriate) radiation, if needed, to permit patterning by development of the black matrix layer 92. In some cases, the black matrix material could be a thermally curable polymer with suspended dark pigment. The processing of the black matrix material in this case involves careful control of the degree of curing, or cross-linking, in the black matrix film. After deposition of the black matrix material, the film is partially cured to a point to permit patterning by development in standard TAMH baths. These types of black matrix materials are commercially available, such as DARC 400 from Brewer Science (Danvers, Mass., http://www.brewerscience.com/).

Figure 7A:
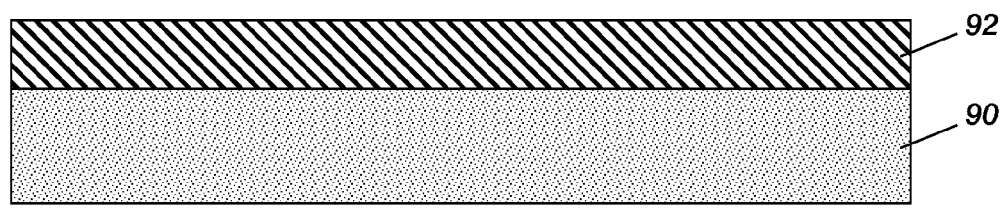
FIG. 7A is a cross sectional view of a structure at a first stage in the process of forming a sub-pixel frame according to a third embodiment of the present invention.
Figure 7B:
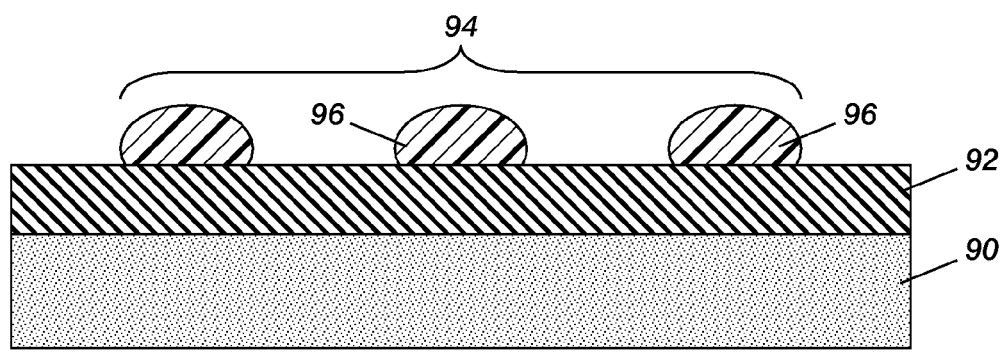
FIG. 7B is a cross sectional view of a structure at a second stage in the process of forming a sub-pixel frame according to a third embodiment of the present invention.
Figure 8:
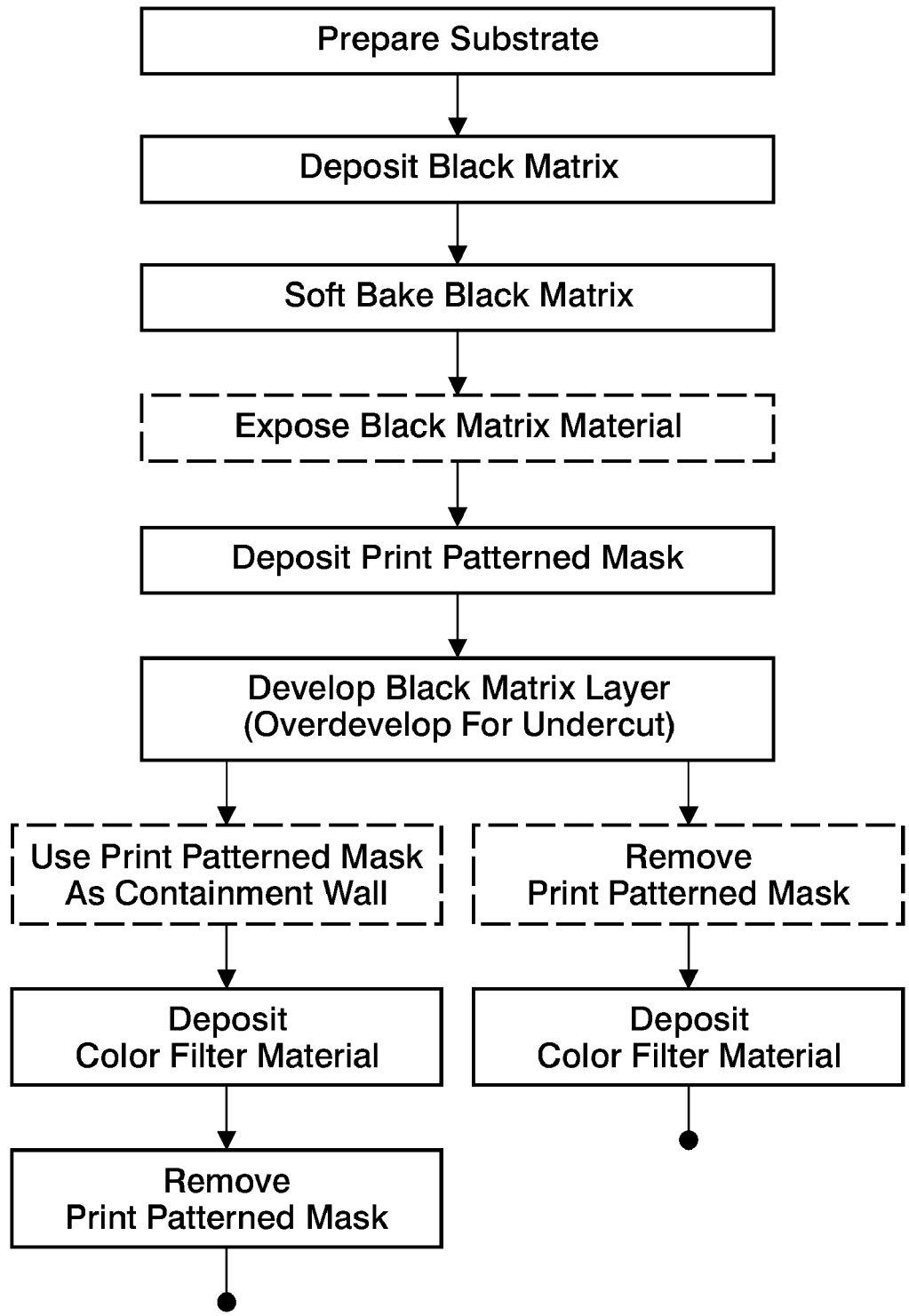
FIG. 8 is a process flow diagram illustrating the steps involved in the formation of a sub-pixel frame element according to a third embodiment of the present invention.

A print patterned mask 94 is then formed on the surface of black matrix layer 92, as shown in FIG. 7B. Print patterned mask 94 is preferably a stearyl erucamide wax deposited by a digital lithography system as previously described. Print patterned mask 94 is shown as a series of non-contiguous single droplets 96 on the order of 25-30 μm in diameter. While mask 94 is illustrated as a discrete single droplets in FIG. 7B, it will be appreciated that mask 94 may be comprised of a plurality of individual or coalesced droplets. The structure may then be soft baked to decrease the etch rate.

In cases where there is overlapping print patterned masks, such as at the intersections of a grid structure, the width of the printed feature may be wider relative to the other non-overlapping print-patterned masks. In such cases, the droplet ejection over another existing printed feature can be stopped or delayed to offset the placement of the droplets to either side of the existing feature. The ejection frequency or print speed may also be modified such that the ejected drops over an existing feature have a smaller drop volume, which results in a smaller linewidth at the overlapped region.

Figure 7C:
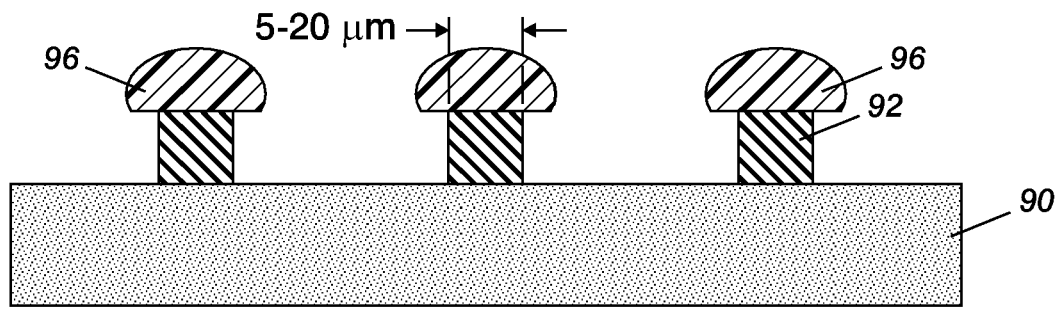
FIG. 7C is a cross sectional view of a structure at a third stage in the process of forming a sub-pixel frame according to a third embodiment of the present invention.

With reference to FIG. 7C, black matrix layer 92 is then developed, by techniques and with materials, such as TMAH, known in the art. Mask 94 serves initially as a physical mask to protect areas thereunder from development. However, the development of black matrix layer 92 continues in a controlled fashion such that a desired amount of the black matrix material underneath mask 94 is removed. The development rate is relatively constant, so that a fine degree of control is permitted over material removal. The undercut dissolution process with black matrix material behaves similarly to the positive photoresist process. The dissolution rate will depend on the specific black matrix and developer formulation along with the process parameters. The development process proceeds until the width of the remaining black matrix material is as desired, for example on the order of 5-20 μm. The development process is then halted by removal of the developer and rinsing the structure, as is well known.

Print patterned mask 94 may next be removed. Depending on the material used for the mask, certain solvents and etching solutions are effective for this removal. In the case where print patterned mask 94 is a stearyl erucamide wax, SVC-28 is effective for its removal. The structure now appears as shown in FIG. 7D.

Figure 7D:
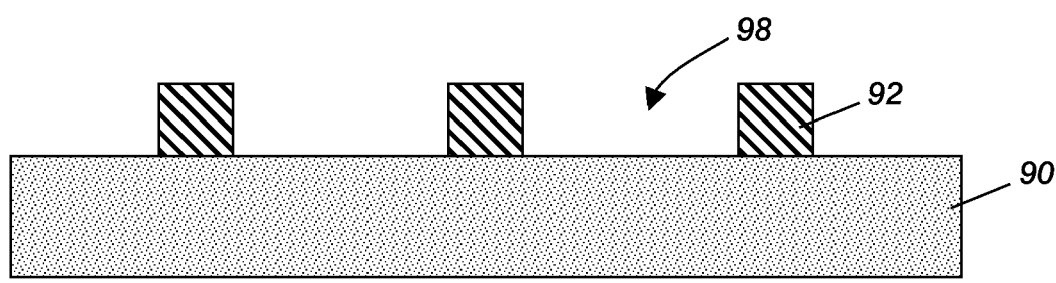
FIG. 7D is a cross sectional view of a structure at a fourth stage in the process of forming a sub-pixel frame according to a third embodiment of the present invention.
Figure 7E:
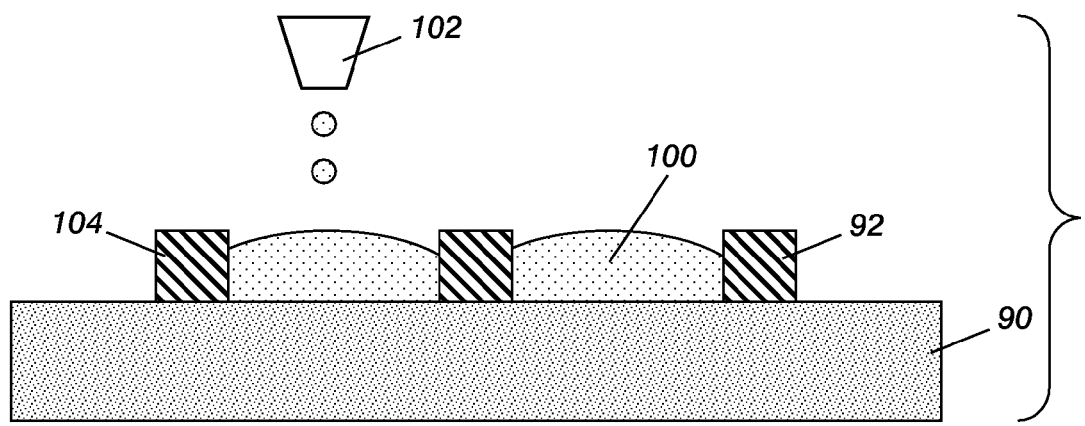
FIG. 7E is a cross sectional view of a sub-pixel frame manufactured according to a third embodiment of the present invention being filled with color filter material.

The removal of the masking material results in the formation of wells 98 in the regions between the remaining black matrix material, as shown in FIG. 7D. The pattern of the black matrix material remaining after its development may be selected to bound wells 98 on all sides. Thus, wells 98 form convenient receptacles for color filter material. The color filter material may comprise a pigmented polymer, for example. The pigment may selectively permit the transmission of red, green or blue light. The appropriate color filter material 100 may thus be deposited, for example by a digital lithographic system, into selected wells to form sub-pixels for the color filter, as shown in FIG. 7E. For example, an ink jet printing system 102 may be employed to first fill every first, fourth, seventh, etc., well with a red tinted filter material. That same system may then be employed to deposit a green pigmented filter material in every second, fifth, eighth, etc., well. And likewise, a blue pigmented color filter material may be deposited in a third pass over the structure into every third, sixth, ninth, etc., well.

In some cases, it is advantageous to modify the wettability of the sidewall of the wells 98 to improve the uniformity of the printed color filter material by controlling its drying. If the black matrix material is initially very hydrophobic, or relatively non-wetting to the solvent carrying the color filter material, the substrate can be exposed to a surface treatment, such as an oxygen plasma or exposure to ozone, before removal of the printed mask layer to produce hydrophilic, or relatively wetting sidewalls. If the printed mask is removed, the top surface of the black matrix material be relatively non-wetting to the solvent for the color filter while the sidewall will be relatively wetting towards the solvent.

Figure 7F:
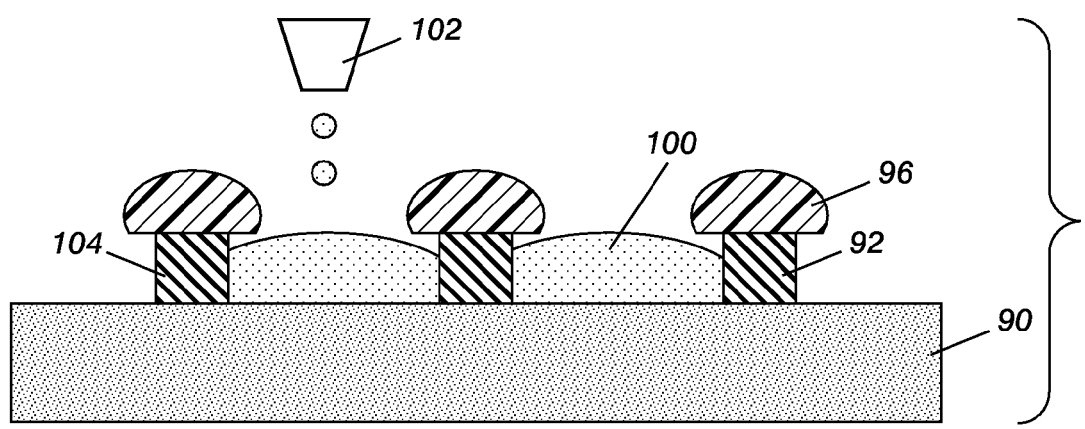
FIG. 7F is an alternate cross sectional view of a sub-pixel frame manufactured according to a third embodiment of the present invention being filled with color filter material.

In the deposition of the color filter materials, care must be taken to prevent cross-contamination of the various individual color filter materials. For example, any introduction of the green color filter material into the well containing the red color filter material will result in poor color separation of the final display. Such cross contamination can occur due to inaccuracies in the filling of the wells, from physical disruption of the color filter structure, from inadequate sub-pixel frame structure, and from wetting of the color filter material causing it to spread out of its designated well and into surrounding wells. Thus, according to an alternative process, the color filter material 100 is deposited into wells 98 prior to the removal of the print patterned mask 94, so that the masking material may assist in physically preventing the color filter material from migrating over the sub-pixel frame into neighboring sub-pixels. This is illustrated in FIG. 7F.

Figure 7G:
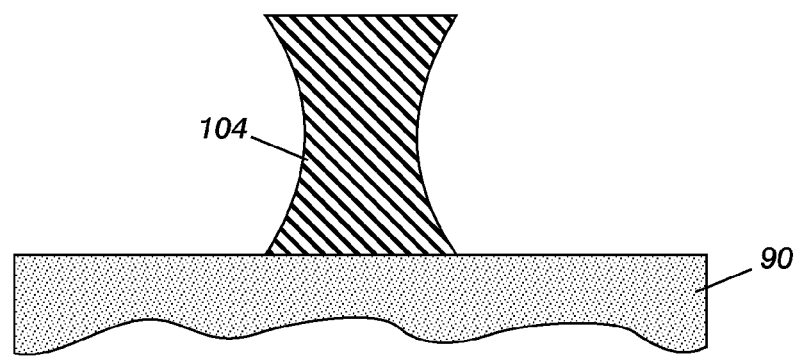
FIG. 7G is an illustration and FIG. 7H is an optical micrograph, respectively, showing of the profile of a sub-pixel frame element manufactured according to a third embodiment of the present invention.
Figure 7H:
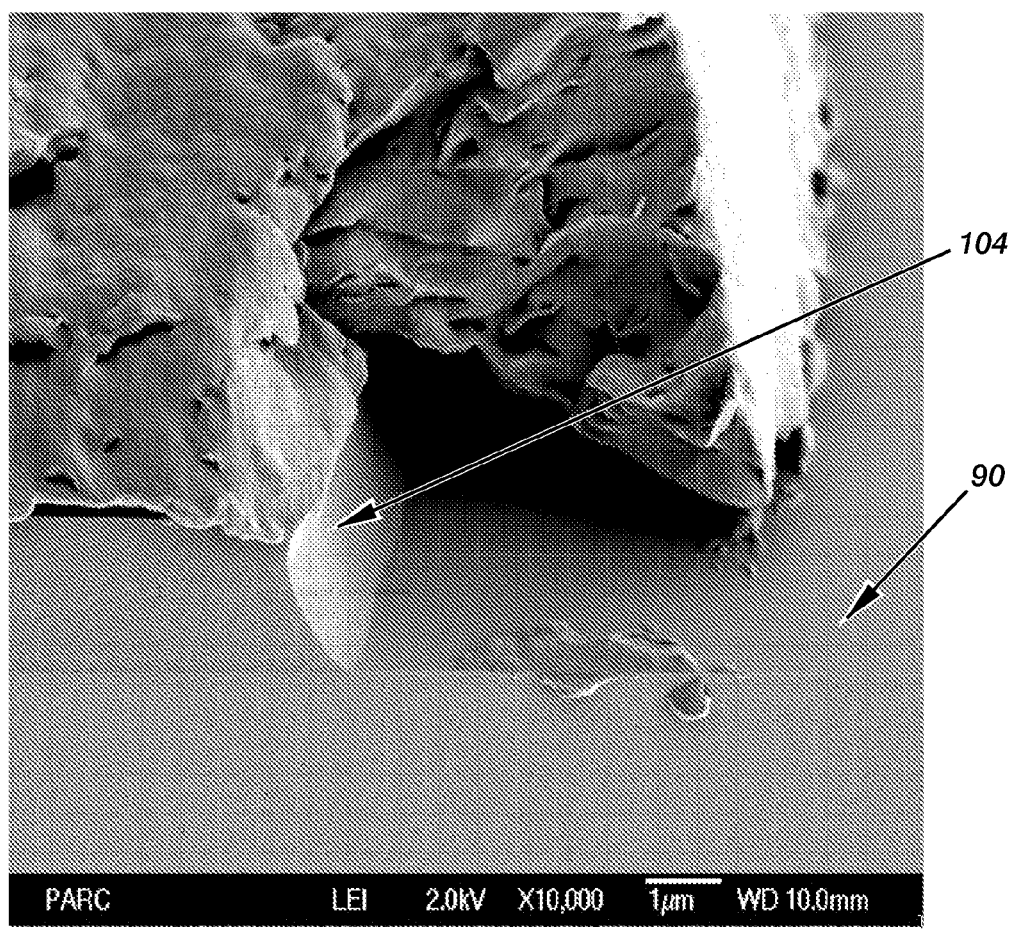

One advantage of the present invention is that due to the development process forming the sub-pixel frame elements 102 (the black matrix features), the cross sections of elements 102 will tend to be concave or curve inward, as illustrated in FIG. 7G, which tends to reduce wetting of the color filter material over the sub-pixel frame. This stands in sharp contrast to prior art structures, which typically have a profile tapering outward toward the top of the well, which in fact promotes wetting of the color filter material into neighboring wells. FIG. 7H is an optical micrograph showing the actual sidewall profile for a sub-pixel frame element according to the present invention. The sidewall profile was found to be slightly curved on the surface with a positive sidewall angle. The positive angle is expected due to an isotropic dissolution of the resist. The curved profile at the resist surface indicates that during the undercut process mass transport is limited. As the undercut distance increases, mass transport of reactive species becomes more limited. It will be appreciated that in certain embodiments it may be possible to control the degree of curvature or concavity of the sub-pixel frame elements by controlling development process.

Figure 9:
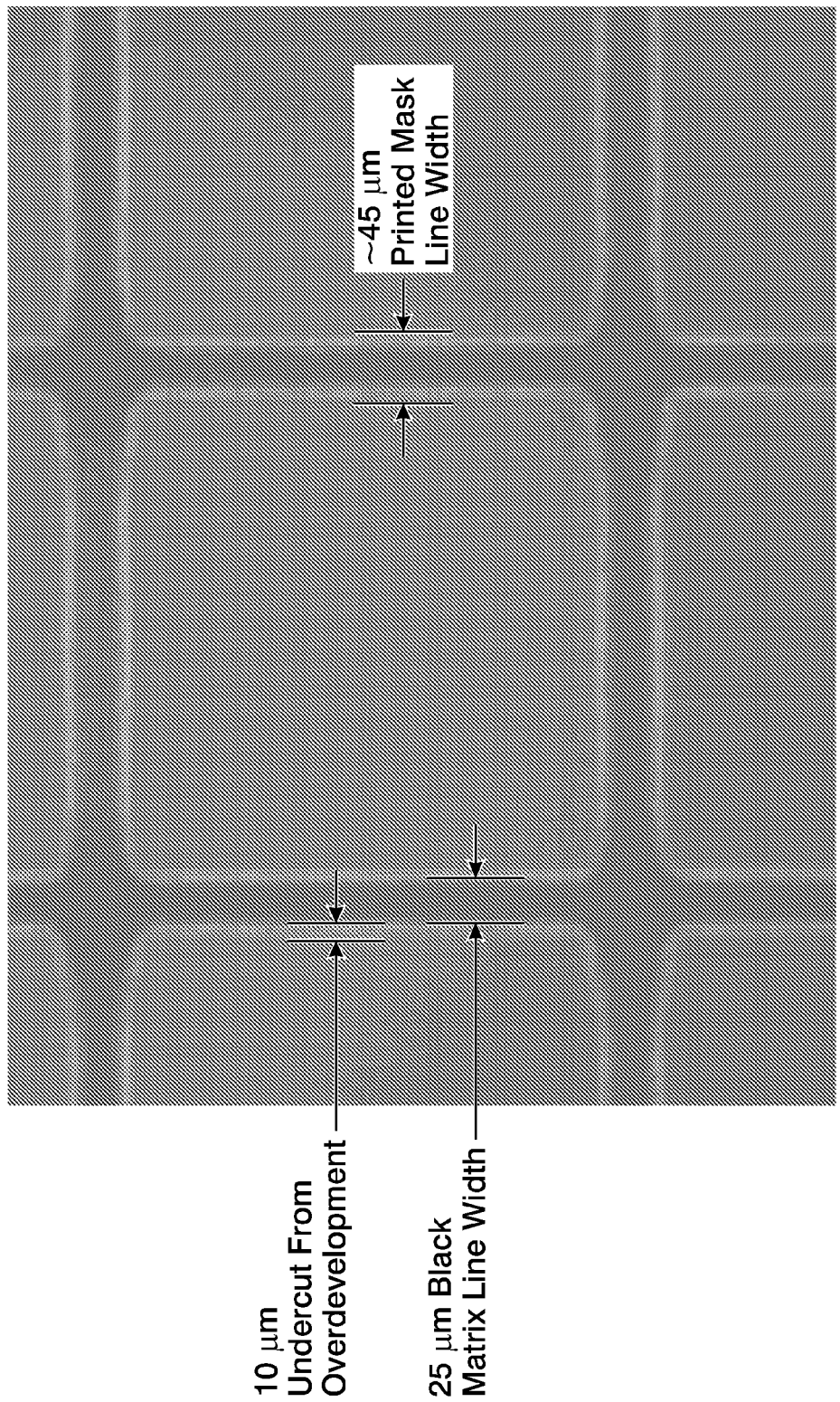
FIG. 9 is an optical micrograph of a sub-pixel frame element manufactured according to a third embodiment of the present invention.

FIG. 9 is an optical micrograph of a color filter sub-pixel frame fabricated according to the process described above. The black matrix for this structure was overdeveloped by 200%. The structure was examined with an optical microscope through the substrate. As can be seen, the mask width was on the order of 45 μm, and the final line width obtained by the present invention was 25 μm.

Figure 10:
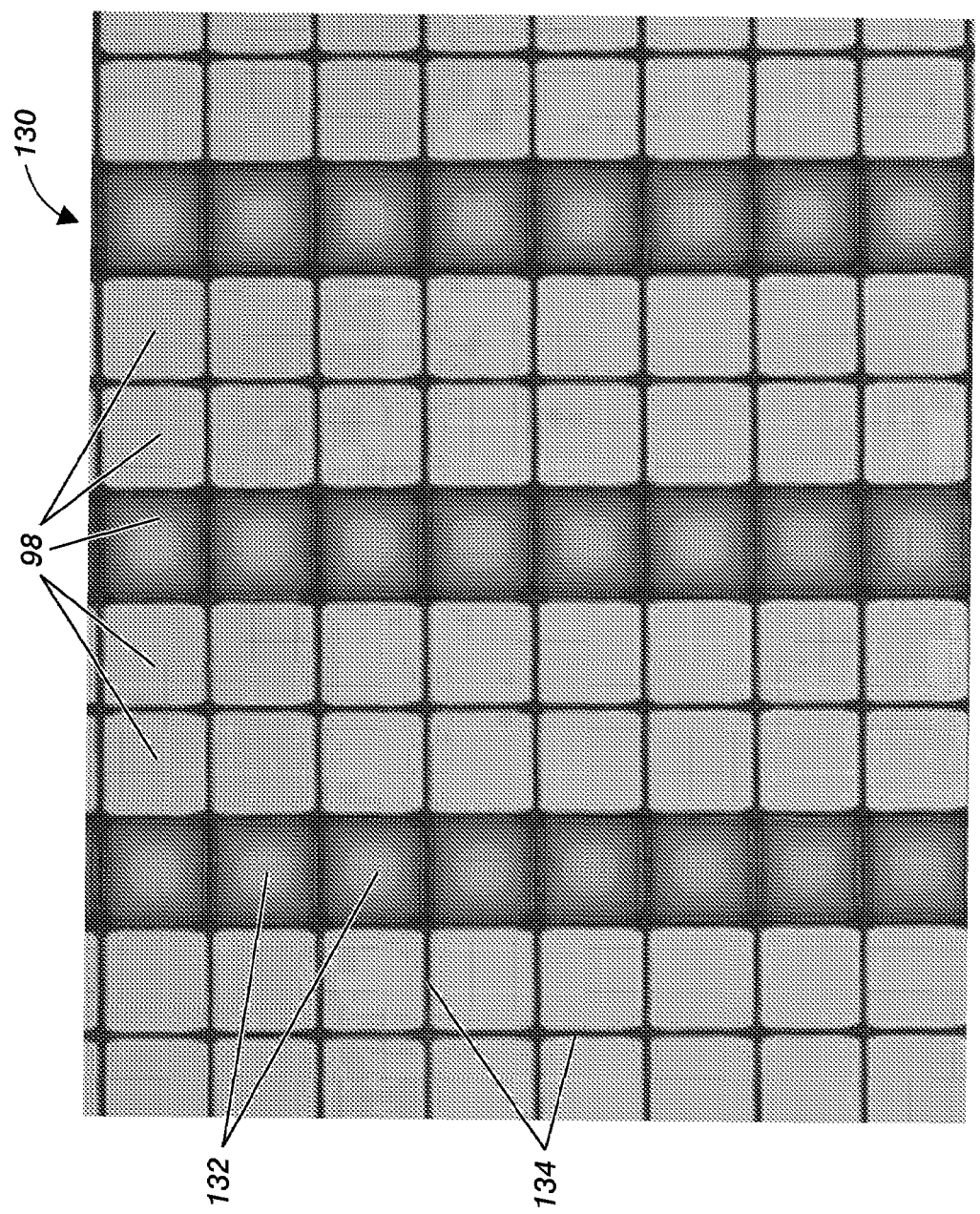
FIG. 10 is a back-side view of a sub-pixel frame with color filter material deposited therein, fabricated according to an embodiment of the present invention.

FIG. 10 is a back side photographic image of a sub-pixel frame 130 formed to include a number of wells 98. A number of such wells 132 are filled with a color filter material transmissive to green light and absorptive to other optical wavelengths. Black matrix material sub-pixel elements 134 are approximately 25 μm in width. As can been seen in FIG. 10, the color filter material is effectively limited to the wells 98 by the process described herein.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. For example, the fabrication of a number of features, devices, and structures have been described. However, the present invention is not limited to the production of only these features, devices, and structures. Furthermore, while the foregoing description has been in terms of an ejection-type printing system, screen or other similar patterned printing techniques may also be employed to produce a similar method and result. Accordingly, the foregoing detailed description provides those of ordinary skill in the art with a convenient guide for implementation of the invention to fabricate a wide variety of features, devices, and structures, and contemplates that various changes in the functions and arrangements of the described embodiments may be made without departing from the spirit and scope of the invention defined by the claims thereto.

What is claimed is:

1. A method of forming a structure, comprising the steps of:
    depositing over a substrate a photoresist layer;
    exposing the photoresist layer such that the solubility of substantially all of the photoresist layer is altered;
    depositing a phase change material over the photoresist layer;
        the phase change material deposited using a printing system comprising a printhead;
        the printhead including at least one ejector for ejecting the phase change material in liquid phase;
        the phase change material deposited in a printed pattern such that the printed pattern remains following a change from liquid phase to solid phase of the phase change material; and
    removing the photoresist layer except in a region underlying the printed pattern of phase change material and a portion but not all of the photoresist layer underlying the printed pattern of phase change material;
        such that a fine feature of photoresist layer is formed over the substrate, whose width is less than the width of that portion of the phase change material originally located thereover.

2. The method of claim 1, wherein said photoresist layer is deposited directly on said substrate.

3. The method of claim 1, wherein said phase change material is deposited directly on said photoresist layer.

4. The method of claim 1 further comprising the step of depositing a thin film material over the substrate, photoresist layer fine feature, and phase change material prior to removal of the phase change material.

5. The method of claim 4, further comprising the step of removing the photoresist fine feature, and whereby upon removal of the phase change material and photoresist fine feature, that thin film material located over the photoresist fine feature and phase change material is likewise removed, leaving in place the thin film material elsewhere deposited.

6. The method of claim 1, wherein the photoresist layer underlying the printed pattern of phase change material is removed leaving a photoresist fine feature whose width is in the range of 5 to 20 μm.

7. The method of claim 1, further comprising the step of depositing a thin film material on the substrate, and wherein the step of depositing the photoresist layer comprises the step of depositing the photoresist layer on the thin film material.

8. The method of claim 7, further comprising the steps of:
    removing the phase change material following the step of removing portions of the photoresist layer; and
    removing the thin film material except in a region underlying the photoresist fine feature, of target material, such that a fine feature of thin film material is formed over the substrate, whose width is less than the width of that portion of the phase change material originally located thereover.

9. The method of claim 8, wherein the thin film material underlying the target material fine feature is removed leaving a thin film material fine feature whose width is in the range of 5 to 20 μm.

10. A method of forming a structure, comprising the steps of:
- depositing over a substrate a thin film material;
- depositing over the thin film material a photoresist material;
- exposing the photoresist material to radiation such that the solubility of substantially all of the photoresist material is altered;
- depositing a phase change material over the photoresist material;
  - the phase change material deposited using a printing system comprising a printhead;
  - the printhead including at least one ejector for ejecting the phase change material in liquid phase;
  - the phase change material deposited in a printed pattern such that the printed pattern remains following a change from liquid phase to solid phase of the phase change material;
- developing the photoresist material except in a region underlying the printed pattern of phase change material, and developing a portion but not all of the photoresist material layer underlying the printed pattern of phase change material, such that a fine feature of photoresist material is formed over the thin film material, whose width is less than the width of that portion of the phase change material located thereover;
- removing the phase change material; and
- removing the thin film material except in a region underlying the fine feature of photoresist material, such that a fine feature of thin film material is formed over the substrate, whose width is less than the width of that portion of the phase change material originally located thereover.

11. The method of claim 10, wherein the thin film material is a conductive metal.

12. The method of claim 10, wherein the thin film material is a semiconductive material.

13. The method of claim 10, wherein the thin film material underlying the photoresist material fine feature is removed leaving a thin film material fine feature whose width is in the range of 5 to 20 µm.

14. The method of claim 10, wherein the printed pattern of phase change material includes layered phase change material regions where regions of the phase change material are deposited over previously deposited regions of phase change material, further comprising the step of controlling linewidth in the layered phase change material regions by selectively discontinuing phase change material ejection in the layered phase change material region.

15. The method of claim 10, wherein the phase change material is deposited in droplets at a selected frequency, and further wherein the printed pattern of phase change material includes layered phase change material regions where regions of the phase change material are deposited over previously deposited regions of phase change material, further comprising the step of controlling linewidth in the layered phase change material regions by selectively changing the drop deposition frequency in the layered phase change material region.

16. The method of claim 10, wherein the printed pattern of phase change material includes layered phase change material regions where regions of the phase change material are deposited over previously deposited regions of phase change material, further comprising the step of controlling linewidth in the layered phase change material regions by selectively controlling the speed of printing the phase change material in the layered phase change material region.

17. A method of forming a structure, comprising the steps of:
- depositing over a substrate a photoresist material;
- exposing the photoresist material to radiation such that the solubility of substantially all of the photoresist is altered;
- depositing a phase change material over the photoresist material;
  - the phase change material deposited using a printing system comprising a printhead;
  - the printhead including at least one ejector for ejecting the phase change material in liquid phase;
  - the phase change material deposited in a printed pattern such that the printed pattern remains following a change from liquid phase to solid phase of the phase change material;
- developing the photoresist material except in a region underlying the printed pattern of phase change material, and developing a portion but not all of the photoresist material layer underlying the printed pattern of phase change material, such that a fine feature of photoresist material is formed over the substrate, whose width is less than the width of that portion of the phase change material located thereover;
- depositing a thin film material over the substrate, photoresist material fine feature, and phase change material;
- removing the phase change material; and
- removing the photoresist material fine feature;
- whereby upon removal of the phase change material and photoresist material fine feature, that thin film material located thereover is likewise removed, leaving in place the thin film material elsewhere deposited.

18. The method of claim 17, wherein the thin film material remaining after removal of the phase change material and the photoresist material has tapered lateral edges.

19. The method of claim 17, wherein the phase change material pattern includes a gap between two regions of phase change material, wherein the photoresist material is developed below the gap as well as in regions underlying the printed pattern of phase change material and regions underlying the printed pattern of phase change material, such that adjacent, spaced-apart fine features of photoresist material are formed over the substrate, each of whose width is less than the width of that portion of the phase change material located thereover, and whereby upon removal of the phase change material and photoresist material fine features, that thin film material located thereover is likewise removed, leaving in place a thin film fine feature.

20. The method of claim 19, wherein the width of the thin film material fine feature so formed is in the range of 5 to 20 µm.

21. The method of claim 20, wherein the thin film material fine feature has tapered lateral edges.

22. A method of forming a structure, comprising the steps of:
- depositing over a substrate a black matrix material comprising a pigmented photoresist;
- exposing the black matrix material to light in order to alter the solubility of substantially all of the black matrix material;
- depositing a phase change material over the black matrix material;
  - the phase change material deposited using a printing system comprising a printhead;
  - the printhead including at least one ejector for ejecting the phase change material in liquid phase;
  - the phase change material deposited in a printed pattern defining a bounded opening such that the printed pattern remains following a change from liquid phase to solid phase of the phase change material;

removing the black matrix material except in a region underlying the printed pattern of phase change material, and removing a portion but not all of the black matrix material layer underlying the printed pattern of phase change material, such that a bounded structure of black matrix material is formed over the substrate, the bounded structure formed by elements of black matrix material, the width of each element of black matrix material being less than the width of that portion of the phase change material located thereover; and removing the phase change material, leaving in place at least the bounded structure of black matrix material.

23. The method of claim 22, wherein each element of black matrix material is formed to have a generally concave cross section.

24. The method of claim 22, wherein the black matrix material as deposited is relatively hydrophobic, and following the step of removing the black matrix material but prior to the step of removing the phase change material, treating the exposed black matrix material such that it becomes relatively more hydrophilic than originally deposited.

25. The method of claim 22, wherein said treatment comprises treating the exposed black matrix material by exposing it to either an oxygen plasma or to ozone in order to render it relatively more hydrophilic than originally deposited.

26. The method of claim 22, wherein the printed pattern of phase change material includes layered phase change material regions where regions of the phase change material are deposited over previously deposited regions of phase change material, further comprising the step of controlling linewidth in the layered phase change material regions by selectively discontinuing phase change material ejection in the layered phase change material region.

27. The method of claim 22, wherein the phase change material is deposited in droplets at a selected frequency, and further wherein the printed pattern of phase change material includes layered phase change material regions where regions of the phase change material are deposited over previously deposited regions of phase change material, further comprising the step of controlling linewidth in the layered phase change material regions by selectively changing the drop deposition frequency in the layered phase change material region.

28. The method of claim 22, wherein the printed pattern of phase change material includes layered phase change material regions where regions of the phase change material are deposited over previously deposited regions of phase change material, further comprising the step of controlling linewidth in the layered phase change material regions by selectively controlling the speed of printing the phase change material in the layered phase change material region.

29. The method of claim 22, further comprising the step of depositing a color filter material within the bounded structure of black matrix material prior to the step of removing the phase change material.

30. The method of claim 29, wherein the volume of color filter material is no more than 10 times the volume of the bounded structure of black matrix material.

31. The method of claim 29, further comprising the steps of:

hardening the color filter material prior to the step of removing the phase change material, such that upon removal of the phase change material hardened regions of color filter material isolated by black matrix material are formed over the substrate.

* * * * *